United States Patent
Karp et al.

(10) Patent No.: US 10,636,869 B2
(45) Date of Patent: Apr. 28, 2020

(54) MITIGATION FOR FINFET TECHNOLOGY USING DEEP ISOLATION

(71) Applicant: Xilinx, Inc., San Jose, CA (US)

(72) Inventors: James Karp, Saratoga, CA (US); Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/917,206

(22) Filed: Mar. 9, 2018

(65) Prior Publication Data

US 2019/0280086 A1  Sep. 12, 2019

(51) Int. Cl.
| | | |
|---|---|---|
| H01L 29/06 | (2006.01) | |
| H01L 29/78 | (2006.01) | |
| H01L 29/66 | (2006.01) | |
| H01L 27/092 | (2006.01) | |
| H01L 21/8238 | (2006.01) | |
| H01L 21/762 | (2006.01) | |

(52) U.S. Cl.
CPC .... *H01L 29/0649* (2013.01); *H01L 21/76224* (2013.01); *H01L 21/76229* (2013.01); *H01L 21/823821* (2013.01); *H01L 21/823878* (2013.01); *H01L 27/0921* (2013.01); *H01L 27/0924* (2013.01); *H01L 29/66795* (2013.01); *H01L 29/785* (2013.01); H01L 21/823892 (2013.01); H01L 27/0928 (2013.01)

(58) Field of Classification Search
CPC ........... H01L 29/0649; H01L 29/66795; H01L 29/785; H01L 29/41791; H01L 29/0646; H01L 29/0688; H01L 27/00; H01L 27/11807; H01L 27/10826; H01L 27/098; H01L 27/092; H01L 21/8238; H01L 21/762
See application file for complete search history.

(56) References Cited

U.S. PATENT DOCUMENTS

| | | | |
|---|---|---|---|
| 4,683,488 A | 7/1987 | Lee et al. | |
| 5,612,242 A * | 3/1997 | Hsu | H01L 21/3086 |
| | | | 257/E21.235 |
| 6,617,912 B1 | 9/2003 | Bauer | |
| 6,624,654 B1 | 9/2003 | Trimberger | |
| 6,671,202 B1 | 12/2003 | Bauer | |
| 6,720,793 B1 | 4/2004 | Trimberger | |
| 6,735,110 B1 | 5/2004 | Lesea | |
| 6,798,270 B1 | 9/2004 | Bauer | |

(Continued)

OTHER PUBLICATIONS

Zarlink Semiconductor, "Understanding and Eliminating Latch-up in CMOS Ppplications," App Note MSAN-107, Jul. 1993, pp. 1-16, Zarlink Semiconductor, acquired by Microsemi, Aliso Viejo, California, USA.

(Continued)

*Primary Examiner* — Galina G Yushina
(74) *Attorney, Agent, or Firm* — Patterson + Sheridan, LLP (57) ABSTRACT

FinFET, P-N junctions and methods for forming the same are described herein. In one example, a FinFET is described that includes a fin having a channel region wrapped by a gate, the channel region connecting a source and a drain. A first isolation layer is disposed on a first side of the fin and a second isolation layer is disposed on a second side of the fin, where the second side is opposite of the first side. The second isolation layer has a thickness greater than a thickness of the first isolation layer.

11 Claims, 6 Drawing Sheets

(56) References Cited

U.S. PATENT DOCUMENTS

| | | |
|---|---|---|
| 6,809,957 B2 | 10/2004 | Lesea |
| 6,812,731 B1 | 11/2004 | Trimberger |
| 6,822,894 B1 | 11/2004 | Costello et al. |
| 6,903,571 B1 | 6/2005 | Trimberger |
| 6,914,804 B2 | 7/2005 | Lesea |
| 7,064,574 B1 | 6/2006 | Voogel et al. |
| 7,111,215 B1 | 9/2006 | Keller et al. |
| 7,139,190 B1 | 11/2006 | de Jong |
| 7,236,000 B1 | 6/2007 | Steiner |
| 7,249,010 B1 | 7/2007 | Sundararajan et al. |
| 7,298,168 B1 | 11/2007 | Steiner |
| 7,386,826 B1 | 6/2008 | Keller et al. |
| 7,409,610 B1 | 8/2008 | Drimer |
| 7,515,452 B1 | 4/2009 | de Jong et al. |
| 7,701,247 B1 | 4/2010 | Nelson |
| 7,764,081 B1 | 7/2010 | Tuan et al. |
| 7,852,107 B1 | 12/2010 | Sundararajan |
| 7,990,173 B1 | 8/2011 | Tseng et al. |
| 8,065,644 B1 | 11/2011 | Jacobson et al. |
| 8,261,229 B2 | 9/2012 | Hart |
| 8,384,418 B1 | 2/2013 | Lu et al. |
| 8,397,191 B1 | 3/2013 | Lesea |
| 8,635,581 B1 | 1/2014 | Tseng et al. |
| 8,692,381 B1 | 4/2014 | Hart |
| 9,183,338 B1 | 11/2015 | Jain et al. |
| 9,472,669 B1 * | 10/2016 | Chiang ............... H01L 29/7848 |
| 9,483,599 B1 | 11/2016 | Jain et al. |
| 9,484,919 B1 | 11/2016 | Jain et al. |
| 2008/0029821 A1 | 2/2008 | Yamagami et al. |
| 2010/0015778 A1 * | 1/2010 | Lin .................. H01L 21/76232 438/443 |
| 2011/0074498 A1 * | 3/2011 | Thompson ........ H01L 21/82341 327/543 |
| 2013/0026572 A1 * | 1/2013 | Kawa ................. H01L 27/0207 257/347 |
| 2013/0221443 A1 * | 8/2013 | Lin ..................... H01L 27/0924 257/368 |
| 2014/0353715 A1 * | 12/2014 | Xiao .................. H01L 27/0886 257/190 |
| 2015/0060959 A1 | 3/2015 | Lin et al. |
| 2015/0311201 A1 | 10/2015 | Ju et al. |
| 2016/0093714 A1 * | 3/2016 | Wang ............... H01L 29/66537 257/48 |
| 2016/0293756 A1 * | 10/2016 | Liu .................... H01L 29/7827 |

OTHER PUBLICATIONS

Peng, Jing-Jie et al., "Latch-up Self-Stop Circuit for Whole-Chip Latchup Prevention in Bulk CMOS Integrated circuits;" May 26, 2002, pp. V-537 to V-540, Proc. of the 2002 IEEE International Symposium on Circuits and Systems, IEEE, Piscataway, New Jersey, USA.

Karp, James et al., "Single-Event Latch-Up: Increased Sensitivity From Planar to FinFET," Jan. 2018, pp. 217-222, IEEE Transactions on Nuclear Science, vol. 65, No. 1, IEEE, Piscataway, New Jersey, USA.

\* cited by examiner

MITIGATION FOR FINFET TECHNOLOGY USING DEEP ISOLATION

TECHNICAL FIELD

Embodiments of the present invention generally relate to FinFETs, P-N junctions and methods for forming the same. More particularly, embodiments of the present invention relate to FinFETs and P-N junctions having deep isolation layers.

BACKGROUND

FinFETs have begun to replace traditional planar transistors in next generation electronic devices due to the ability to enhance the control of current flowing between source and drain regions of the transistors at smaller nanometer nodes. Devices, such as memory structures, also benefit from the use of FinFETs because FinFETs have lower power and provide increased transistor density while enabling improved device performance.

Memory structures that use FinFETs remain susceptible to single event latch-ups (SEL), just like planar transistors. Latch-up in CMOS technologies is caused by the triggering of a parasitic p-n-p-n SCR (silicon controlled rectifier) structure. SEL is caused by transient currents originating from charges generated along the track of an incident charged particle. Neutrons are the primary cause of SEL in terrestrial applications. Conventional SEL mitigation techniques for planar transistor aim to decouple or weaken elements of the parasitic SCR structure. Such techniques are typically associated with an area penalty that can be tolerated for a given application. Until recently both CMOS and underlying SEL device physics have scaled together in planar transistors, thus allowing predictable SEL results for a given design flow. However, this has changed with the recent introduction of FinFET technology as it has been observed that the failure rate associated with SEL events in FinFETs is generally higher than that of planar transistors.

Thus, there is a need for an improved FinFET.

SUMMARY

FinFETs, P-N junctions and methods for forming the same are described herein. In one example, a FinFET is described that includes a fin having channel region wrapped by a metal gate, the channel region connecting a source region and a drain region of the fin. A first isolation layer is disposed on a first side of the fin and a second isolation layer is disposed on a second side of the fin, where the second side is opposite of the first side. The second isolation layer has a thickness greater than a thickness of the first isolation layer.

In another example, a P-N junction is described. The P-N junction includes a first P-type FinFET, a first N-type FinFET and a first isolation layer. The first N-type FinFET is disposed adjacent the first P-type FinFET. The first isolation layer laterally separates the first N-type FinFET from the adjacent the first P-type FinFET. The first isolation layer has a thickness of at least 150 nm.

In still another example, a P-N junction is described that includes a first P-type FinFET, a first N-type FinFET and a first isolation layer. The first N-type FinFET is disposed adjacent the first P-type FinFET. The first isolation layer laterally separates the first N-type FinFET from the adjacent the first P-type FinFET. The P-N junction has a $\beta_{npn} \cdot \beta_{pnp}$ product gain of less than 1.

In yet another example, a method for forming a P-N junction is described that includes etching a semiconductor substrate to form a plurality of high aspect ratio fins, the plurality of high aspect ratio fins including a first high aspect ratio fin and a second high aspect ratio fin separated by a first high aspect ratio trench, filling the first high aspect ratio trench with an oxide material, removing a portion of the oxide material filling the first high aspect ratio trench, and stopping the removal of the oxide material filling the first high aspect ratio trench to form an oxide isolation layer having a thickness of at least 150 nm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

The FinFET technology has significantly improved CMOS performance and has enabled Moore's Law scaling down to advanced nodes of 7 nm and beyond. The manufacturing of FinFETs required a significant change in the geometry of the shallow trench isolation (STI). The purpose of the STI is to electrically isolate adjacent transistors. Advanced planar CMOS transistors have STI depths in the range of about 200 to about 250 nm. For FinFET technologies, the exposed silicon fin is formed by etching-back the STI, which results in an STI depth of between about 70 to about 80 nm. FinFET designs can expect even further STI depth reduction with continued CMOS scaling.

From planar to FinFET designs, the approximately 3 times reduction in the STI depth has significantly reduced the minimum substrate path between source/drain of adjacent pMOS and nMOS transistors. This does not deteriorate p/nMOS isolation during normal CMOS operation, when all p-n junctions are under reverse bias. However, the reduced substrate path between adjacent junctions has been found to allow triggering of parasitic SCR latch-up, when junctions of both pMOS and nMOS transistors can be forward biased during an SEL transient.

As discussed above, conventional FinFETs are susceptible to SEL events due to the reduced substrate path between adjacent junctions. Conventional FinFETs are particularly more susceptible to SEL events due to high energy particle strikes than conventional planar transistors. High energy particles include neutrons, thermal neutrons, alpha particles and the like. In particular, the inventors have observed that 10 times less energy is needed to cause an SEL event due to high energy particle strikes on conventional FinFETs as compared to conventional planar transistors. The inventors have discovered a strong dependence between isolation thickness between N-type and P-type FinFETs and the probability of high energy particle strike SEL events. Thus, the disclosure herein describes techniques for improving the resistance of electronic devices employing FinFETs to SEL events by selectively increasing isolation thickness almost 2-3 times that of conventional FinFETs. Moreover, while the isolation thicknesses between N-type and P-type FinFETs are increased, shallower isolation thicknesses between same types of FinFETs may be maintained. Thus, electronic devices with robust resistance to SEL events may be realized with a minimal increase in fabrication costs. Moreover, the novel FinFETs described herein are at up to 10 times less susceptible to SEL events than traditional FinFETs, desirably approaching and even equaling that of planar transistors.

Figure 1:
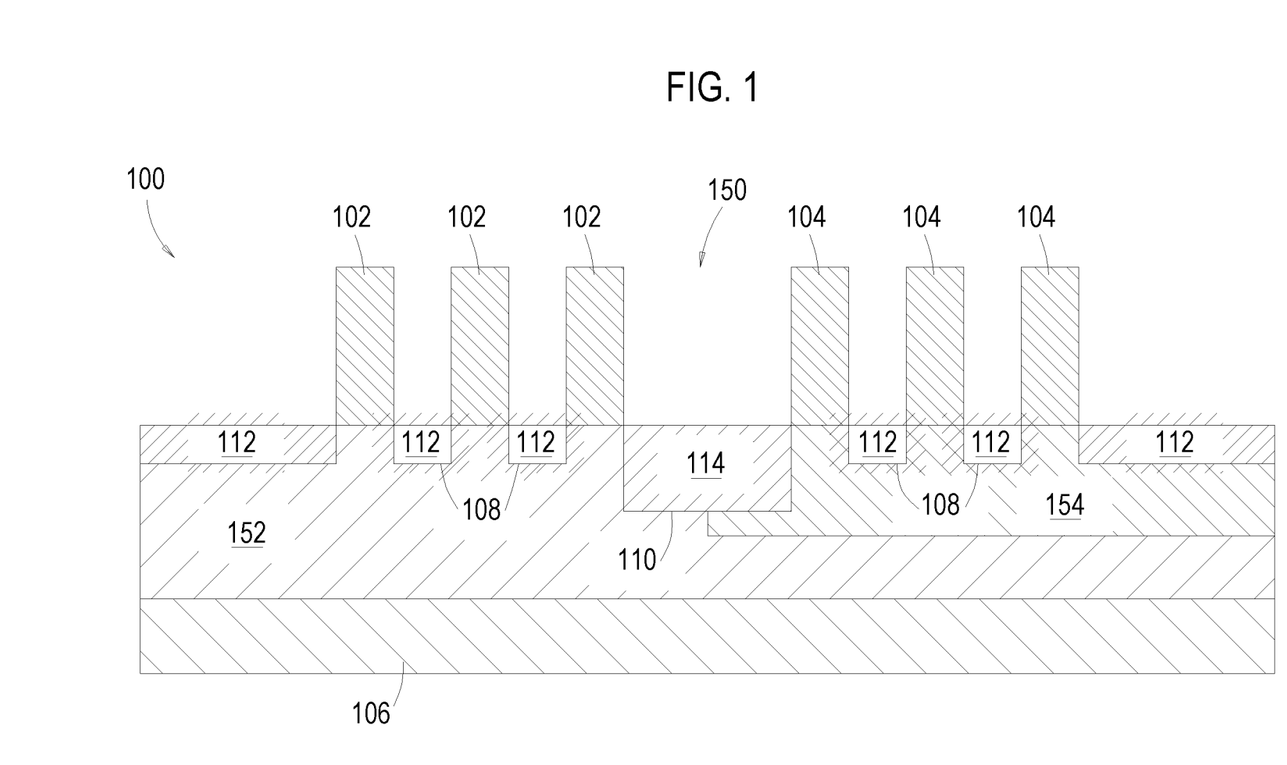
FIG. 1 is a schematic sectional view of an electronic device having a P-N junction that includes FinFETs illustrated in a region outside gates.

FIG. 1 is a schematic diagram of one example of an electronic device 100 illustrated in a region outside gates having a P-N junction 150 defined between an N-type FinFET 102 and an adjacent P-type FinFET 104. In the example of FIG. 1, the electronic device 100 is configured as a CMOS device. However, the FinFETs 102, 104 may be configured for use in other types of devices that include both N-type and P-type FinFETs 102, 104.

The N-type and P-type FinFETs 102, 104 are formed on a semiconductor substrate 106. The FinFETs 102, 104 may be formed by additive or subtractive techniques, including techniques currently known or developed in the future.

The substrate 106 may be a silicon substrate or a substrate comprised of another suitable material. The substrate 106 includes a P-well 152 and an N-well 154. In the example depicted in FIG. 1, the N-well 154 is illustrated as formed on the P-well 152. However, the P-well 152 may alternatively be formed on the N-well 154, or the P-well 152 may be laterally spaced from the N-well 154, for example in a twin-tub configuration. The P-well 152 and the N-well 154 may be formed using ion implantation, diffusion or other suitable technique. In one example, the P-well 152 is doped with phosphorus, while the N-well 154 is doped with boron.

In the example depicted in FIG. 1, there are at least two N-type FinFETs 102 formed on the P-well 152. There are also at least two P-type FinFETs 104 formed on the N-well 154. One of the N-type FinFETs 102 is disposed adjacent to one of the P-type FinFETs 104. An isolation layer 112 is disposed in trench 108 formed between each adjacent FinFET of the same type. For example, the oxide isolation layer 112 is disposed between each pair of adjacent N-type FinFETs 102. The isolation layer 112 is also disposed between each adjacent pair of P-type FinFETs 104. An isolation layer 114 is disposed in a trench 110 formed between adjacent FinFETs of different types. For example, the isolation layer 114 is disposed between the N-type FinFET 102 that is adjacent to the P-type FinFET 104. The depth of a portion of the trench 110 containing isolation material is at least double the depth of a portion of the trench 108 containing isolation material, thus making the thickness of the isolation layer 114 is at least double the thickness of the oxide isolation layer 112. The deeper trench 110 and thicker isolation layer 114 provides excellent resistance against SEL events across the P-N junction 150 as further discussed below.

Figure 2:
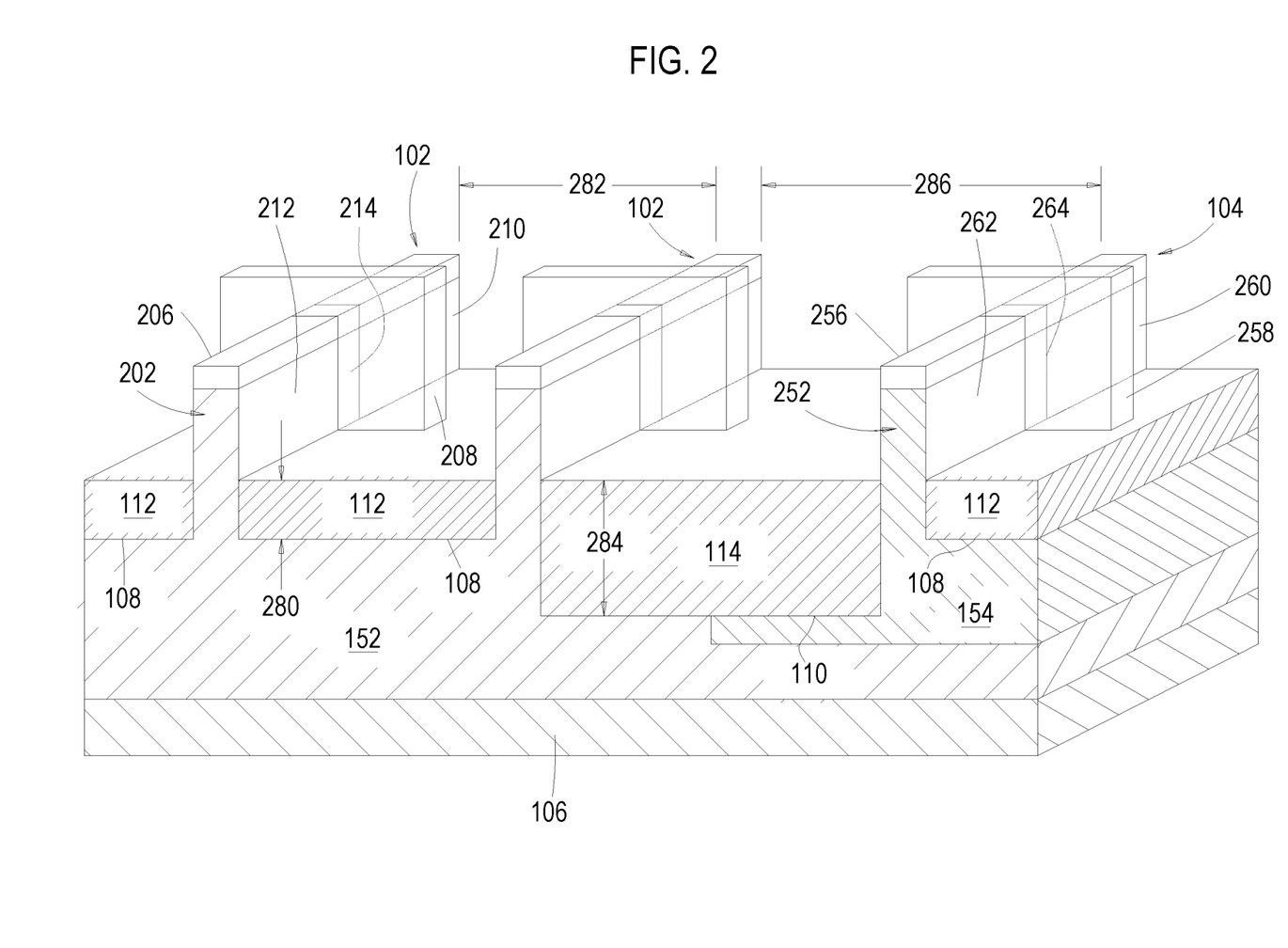
FIG. 2 is an isometric view of a portion of the electronic device of FIG. 1 illustrating a P-type FinFET disposed adjacent an N-type FinFET.

Additional details of the P-N junction 150 are illustrated in the isometric view of a portion of the electronic device 100 of FIG. 1 depicted in FIG. 2. As shown in FIG. 2, the N-type FinFET 102 includes a high aspect ratio fin 202 and a gate 208, both of which extend upwards from the substrate 106. The fin 202 may be formed by additive or subtractive techniques. In one example, the fin 202 may be formed may be formed from silicon, silicon germanium, germanium or III-V material. The fin 202 may be optionally covered with thin oxide capping layer 206.

The isolation layer 112 is formed on the substrate 106 between the fins 202 of the N-type FinFETs 102. In one example, the isolation layer 112 is formed in the trench 108 defined between the fins 202. The isolation layer 112 is formed from one or more of silicon oxide, silicon nitride, silicon oxynitride, fluoride-doped silicate glass (FSG), low-k dielectric, or other suitable material. Similarly, the isolation layer 114 is formed on the substrate 106, such as in the trench 110 defined between the fin 202 of the N-type FinFET 102 and a high aspect ratio fin 252 of the P-the FinFET 104. The isolation layer 114 may be comprised of the same materials suitable for use as the isolation layer 112.

The gate 208 generally has a fin-shape that is perpendicular to a plane of the substrate 106 and is also perpendicular to a plane of the fin 202. The gate 208 surrounds a portion of the fin 202, separates a source region 212 of the fin 202 from a drain region 210 of the fin 202. The source and drain regions 212, 210 are generally aligned in a common plane extending perpendicular to a plane of the substrate 106. The source and drain regions 212, 210 also are oriented perpendicular to a plane of the gate 208.

The gate 208 wraps around a channel region 214 defined between the source and drain regions 212, 210. The channel region 214 is formed from the same material as the regions 212, 210 as the channel region 214 is an integral part of the fin 202. When the gate 208 is energized, current flows through the channel region 214 from the source region 212 to the drain region 210.

The gate 208 is formed from a gate electrode disposed over a gate dielectric material. The gate dielectric material separates the gate electrode from the channel region 214. The gate electrode may be polysilicon, Ta, TiN, TiAlN, TiSiN, TaN, TaAlN, TaSiN, W, WN, Re, Ir, Ru, Mo, Al, Cu, CO, Ni, WN/RuO$_2$, ZrSi$_2$, MoSi$_2$, TaSi$_2$, NiSi$_2$, or other suitable material.

The gate dielectric material may be a high-K oxide, such as a hafnium based material. Examples of hafnium based materials that are suitable for use as the gate dielectric material include HfO$_x$, HfSiO$_x$, HfSiON, HfZrO, HfLaO, HfTaO, HfTiO and the like. Alternatively, the gate dielectric material may LaO, AlO, ZrO, ZrO2, ZrSiO2, LaSiO, AlSiO, TiO, Ta$_2$O$_5$, Ta$_2$O$_3$, Y$_2$O$_3$, STO, BTO, BaZrO, or other suitable material. In one example, the metal gate 208 is formed from a polysilicon gate electrode disposed over an HfO$_x$ gate dielectric material.

The gate 208 may also include additional layers, such as capping layers and interfacial layers. For example, a capping layer may be disposed between the gate dielectric material and the gate material. The capping layer may be lanthanum oxide, LaSiO, manganese oxide, aluminum oxide, or other suitable material. The capping layer may have a thickness ranging from about 3 to about 10 angstroms. In another example, an interfacial layer may be disposed between the gate dielectric material and the channel region 214. The interfacial layer may have a thickness ranging from about 3 to about 10 angstroms. The interfacial layer may be an oxide, such as silicon oxide or silicon oxynitride. Alternatively, the interfacial layer may be silicon nitride or other suitable material.

The P-type FinFET 104 includes the fin 252 and a gate 258, both of which extend upwards from the substrate 106. As with the fin 202, the fin 252 may be formed by additive or subtractive techniques. In one example, the fin 252 may be formed may be formed from silicon, silicon germanium, germanium or III-V material. The fin 252 may be optionally covered with thin oxide capping layer 256.

The gate 258 generally has a fin-shape that is perpendicular to a plane of the substrate 106 and is also perpendicular to a plane of the fin 252. The gate 258 surrounds a portion of the fin 252, separates a source region 262 of the fin 252 from a drain region 260 of the fin 252. The source and drain regions 262, 260 are generally aligned in a common plane extending perpendicular to a plane of the substrate 106. The source and drain regions 262, 260 also are oriented perpendicular to a plane of the gate 258.

The gate 258 wraps around a channel region 264 defined between the source and drain regions 262, 260. The channel region 264 is formed from the same material as the regions 262, 260 as the channel region 264 is an integral part of the fin 252. When the gate 258 is energized, current flows through the channel region 264 from the source region 262 to the drain region 260.

The gate 258 is formed from a gate electrode disposed over a gate dielectric material. The gate dielectric material separates the gate electrode from the channel region 264. The gate 258 is constructed similar to as described above with reference to the gate 208, and may also include additional layers, such as capping layers and interfacial layers as described above with reference to the gate 208.

The N-type FinFET 102 are separated by a pitch or distance 282. In one example, the distance 282 is about 42 nm. The N-type FinFET 102 is separated from the P-type FinFET 104 by a distance 286. The distance 286 is generally larger than the distance 282 to accommodate fabrication of the deeper isolation layer 114. For example, the isolation layer 114 has a thickness 284 that is greater than a thickness 280 of the isolation layer 112. In one example, the thickness 284 is at least about twice the thickness 280 of the isolation layer 112. In another example, the thickness 284 is at least three times the thickness 280 of the isolation layer 112. It is contemplated that the distance 286 defining the width of the trench 110 and isolation layer 112 may be tapered or stepped such that the a width at a bottom of the trench 110 is much less than the width at the portion of the trench 110 at which the isolation layer 112 is exposed opposite the substrate 106. For example, the width at the bottom of the trench 110 may be about the same as the distance 282.

In the example depicted in FIG. 2, the thickness 280 of the isolation layer 112 is less than about 100 nm, such as between 70-80 nm. In contrast, the thickness 284 of the isolation layer 114 is greater than 150 nm, such as between 200-250 nm. Stated in another manner, the thickness 284 of the isolation layer 114 is at least twice the thickness 280 of the isolation layer 112. In one example, the thickness 284 of the isolation layer 114 is at least 2.5 times the thickness 280 of the isolation layer 112. In yet another example, the thickness 284 of the isolation layer 114 is at least 3 times the thickness 280 of the isolation layer 112. The deep thickness 284 of the isolation layer 114 assist preventing charged particles from traveling between the wells 152, 154, thus increasing the resistance to SEL events. In one example, the SEL resistance due to the thickness 284 of the isolation layer 114 across the P-N junction 150 is about 10 times greater than that of a conventional FinFET designs.

It should be appreciated that the thickness of the isolation layer 114 selected to improve the resistance to SEL events may be different depending on the technology node and critical dimensions of the FinFET comprising the P-N junction 150, and expected energy levels of the particles present in the environment for which the device was designed for use. For example, terrestrial applications encounter particles having much lower energy levels than applications that are designed to be utilized in hardened or non-terrestrial applications. The thickness 284 of the isolation layer 114 described above has proven suitable for terrestrial applications for FinFET manufactured utilizing the 16 nm technology node. Non-terrestrial applications, such as aerospace or other applications requiring hardening against higher energy particles (relative to normally encountered terrestrial particle), at the same technology node would generally have a thicker isolation layer 114.

The improved the resistance to SEL events achieved utilizing the techniques disclosed herein may also be characterized as reducing the product gain of $\beta_{npn} \cdot \beta_{pnp}$ of the parasitic SCR compared to conventional designs using FinFET technology. Generally, $\beta_{npn}$ and $\beta_{pnp}$ are the gains of the two transistors in the feedback loop of the parasitic SCR. Maintaining the $\beta_{npn} \cdot \beta_{pnp}$ product gain to less than 1 will prevent latch-up. The beta gains for the parasitic bipolars are strong functions of the distance in the SCR current path. Since deeper STI increases this distance it reduces the $\beta_{npn} \cdot \beta_{pnp}$ product gain. The bipolar transistor beta gains also depend on the currents in the bipolar transistors of the parasitic SCR. The higher the currents the higher the $\beta_{npn} \cdot \beta_{pnp}$ product gain. Since said currents are proportional to the deposited charge from an ion strike, the thickness 284 of the oxide isolation layer 114 may be selected such that the $\beta_{npn} \cdot \beta_{pnp}$ product gain is less than a predefined design and radiation environment threshold, such as less than 1 for common terrestrial radiation environments. Higher energy ion strikes encountered in space radiation environments will deposit significantly more charges and cause higher currents in the parasitic bipolar transistors. This in turn will raise the $\beta_{npn} \cdot \beta_{pnp}$ product gain above 1 and the same thickness 284 may not be sufficient to prevent SEL in such space radiation environments. A higher thickness 284 may be required to prevent SEL in such high energy radiation environments.

FIGS. 3A-3H are sectional views of a film stack during different stages of a sequence for forming the electronic device 100 of FIG. 1 having adjacent N-type and P-type FinFETs 102, 104. FIG. 4 is a block diagram of a method 400 for forming an electronic device, such as the electronic device 100 having adjacent N-type and P-type FinFETs 102, 104 such as by the sequence illustrated in FIGS. 3A-3H. It is contemplated that the method 400 may be utilized to form other electronic devices having P-N junctions 150.

Figure 3A:
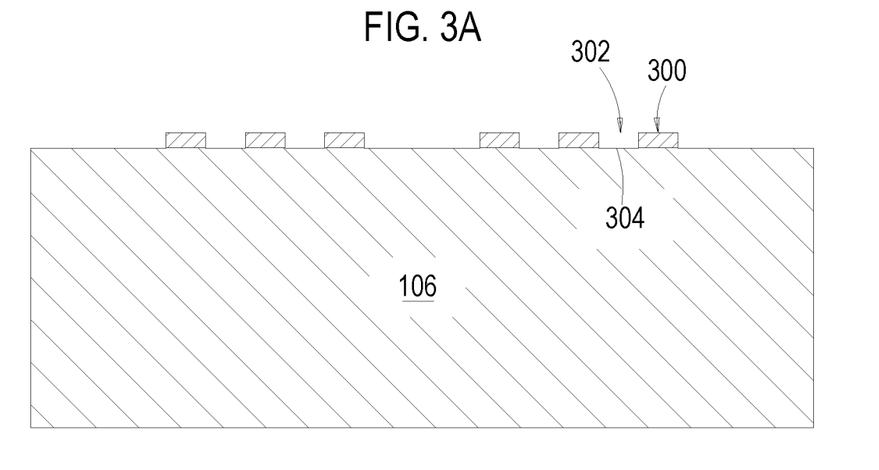
FIGS. 3A-3H are sectional views of a film stack during different stages of a sequence for forming the electronic device of FIG. 1 having adjacent P-type and N-type FinFETs.
Figure 3B:
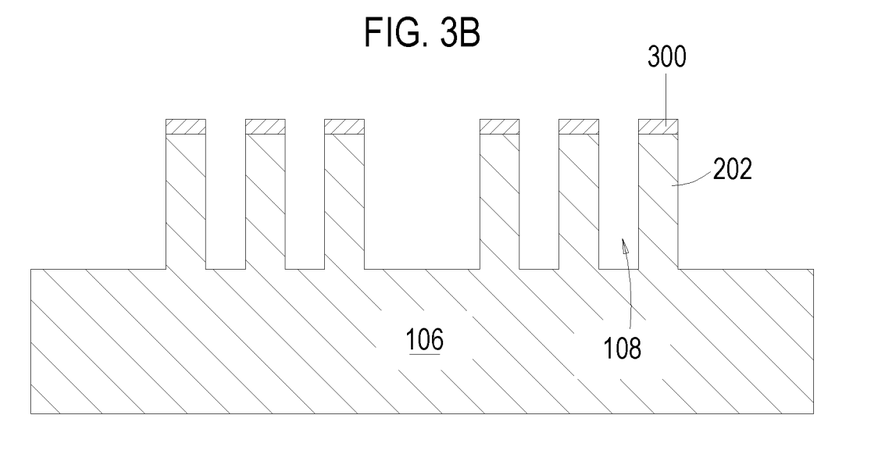

The method 400 begins at operation 402 by patterning a first mask layer 300 on a substrate, such as the substrate 106, such as illustrated in FIG. 3A. The N-well and P-well are not illustrated in FIGS. 3A-3H to avoid cluttering the figures. The first mask layer 300 includes a plurality of openings 302 through which exposed regions 304 of the substrate 106 are exposed for etching and trench formation. The first mask layer 300 may be a photoresist mask, a hard mask or combination thereof.

At operation 404, the exposed regions 304 of the substrate 106 are etched to form trenches 108, as illustrated in FIG.

3B. The trenches 108 formed in the substrate 106 are fabricated by dry (e.g., plasma) etching. Suitable etchants include halogens and halogen containing compounds such as $Cl_2$, $CF_4$, $SF_6$, $NF_3$, and $CCl_2F_2$ among others. Wet etching or other suitable technique may alternatively be utilized. Suitable wet etchants include nitric acid ($HNO_3$) and hydrofluoric acid (HF), potassium hydroxide (KOH), ethylenediamine pyrocatechol (EDP) and tetramethylammonium hydroxide (TMAH), among others.

The material of the substrate 106 remaining between the trenches 108 form the fins 202, 252. The distance 282 between fins 202 is less than the distance 286 between a pair of adjacent fins 202, 252. The distance 282 may be at least half the distance 286, such as at least a quarter of the distance 286. The larger distance 286 between the pair of adjacent fins 202, 252 allows the trench 110 to be much deeper than the trenches 108, thereby facilitating a thicker oxide isolation layer 114 to be disposed in the trench 110 relative to the oxide isolation layer 112 disposed in the trench 108, as further illustrated in later operations of the method 400 described below.

Figure 3C:
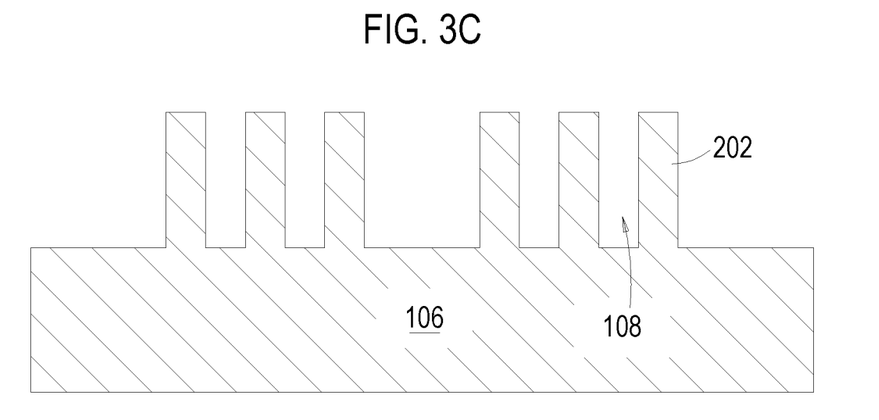
Figure 4:
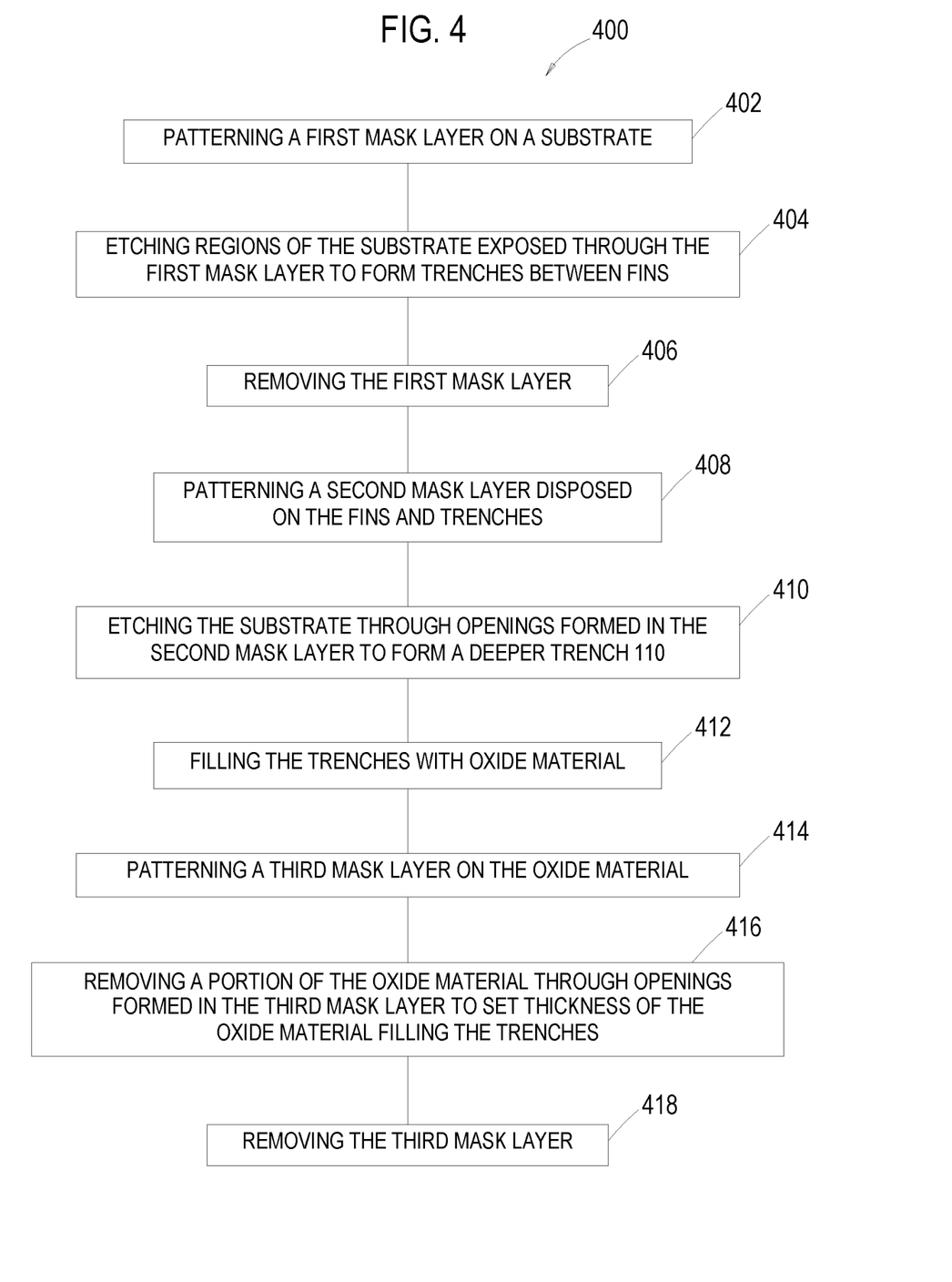
FIG. 4 is a block diagram of a method for forming an electronic device having adjacent P-type and N-type FinFETs.

At operation 406, the first mask layer 300 is removed, as illustrated in FIG. 3C. In one example the first mask layer 300 is removed by an ashing process, such as by exposure to an oxygen containing plasma, or other suitable method.

Figure 3D:
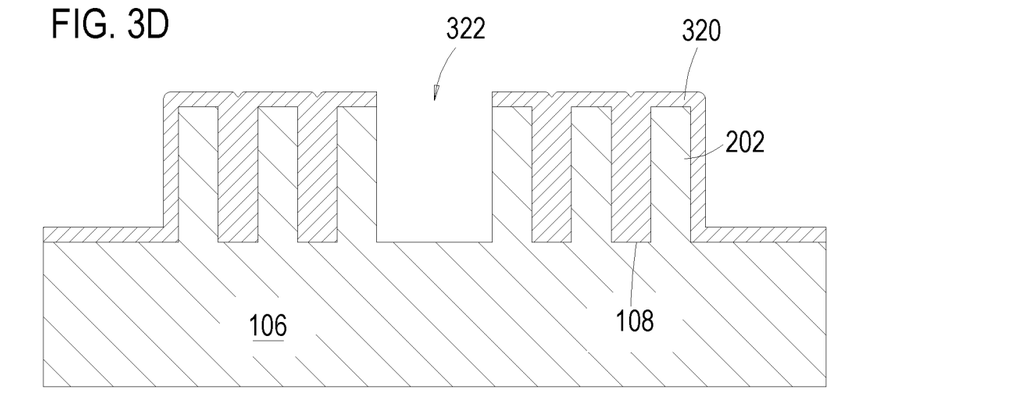

At operation 408, a second mask layer 320 is disposed on the fins 202, 252 and trenches 108. The second mask layer 320 is patterned to form an opening 322 through which the substrate 106 may be etched, such as illustrated in FIG. 3D. The second mask layer 320 may be fabricated and patterned from materials and techniques such as described with reference to the first mask layer 300.

Figure 3E:
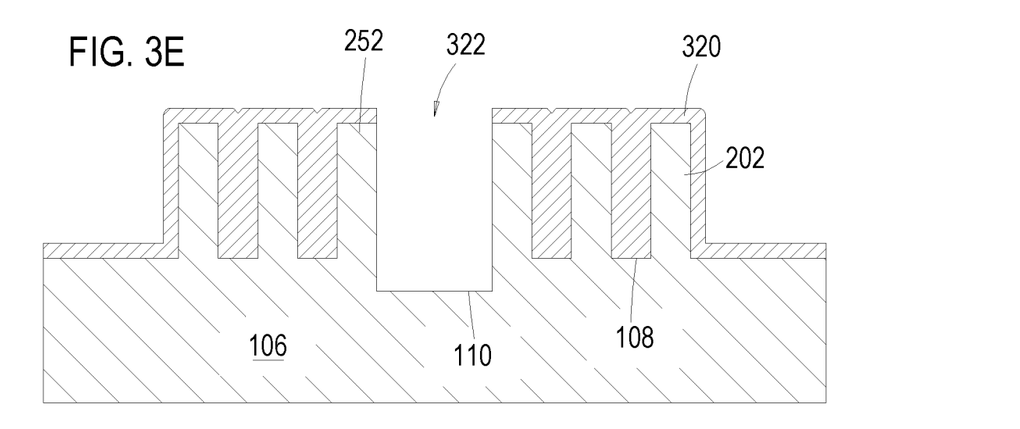

At operation 410, the substrate 106 is etched through the opening 322 in the second mask layer 320 to form the trench 110. As illustrated in FIG. 3E, the trench 110 is deeper than the trench 108. Although not to scale, the trench 110 is at least two times deeper than the trench 108, and even as much as 2.5 or more times deeper than the trench 108. Additionally, the trench 110 is at least about two times wider than the trench 108, such as at least 3 to 4 times deeper than the trench 108. The wider trench 110 facilitates forming a deeper trench 110, such that more oxide isolation layer may be utilized for improved upset resistance from high energy particle strikes. After etching, the second mask layer 320 is removed, for example, by ashing in the presence of an oxygen containing plasma or other suitable method.

Figure 3F:
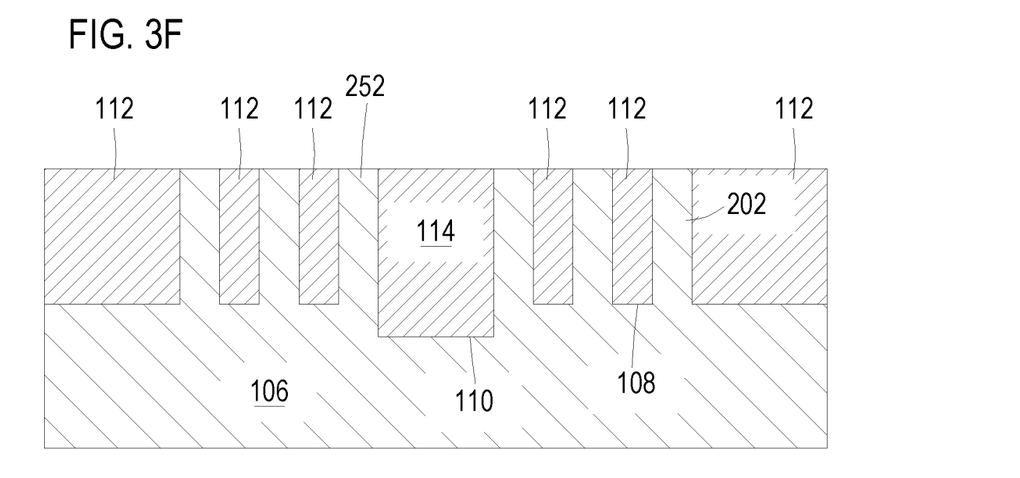

At operation 412, the trenches 108, 110 are filled with material to form the isolation layers 112 and isolation layer 114, as illustrated in FIG. 3F. The isolation layers 112, 114 may be deposited utilizing spin-on, chemical vapor deposition, atomic layer deposition or other suitable technique. A top surface of the isolation layers 112, 114 may be made coplanar with the top surface of the fins 202, 252, for example, using an etch back or chemical mechanical polishing or other suitable planarization technique.

Figure 3G:
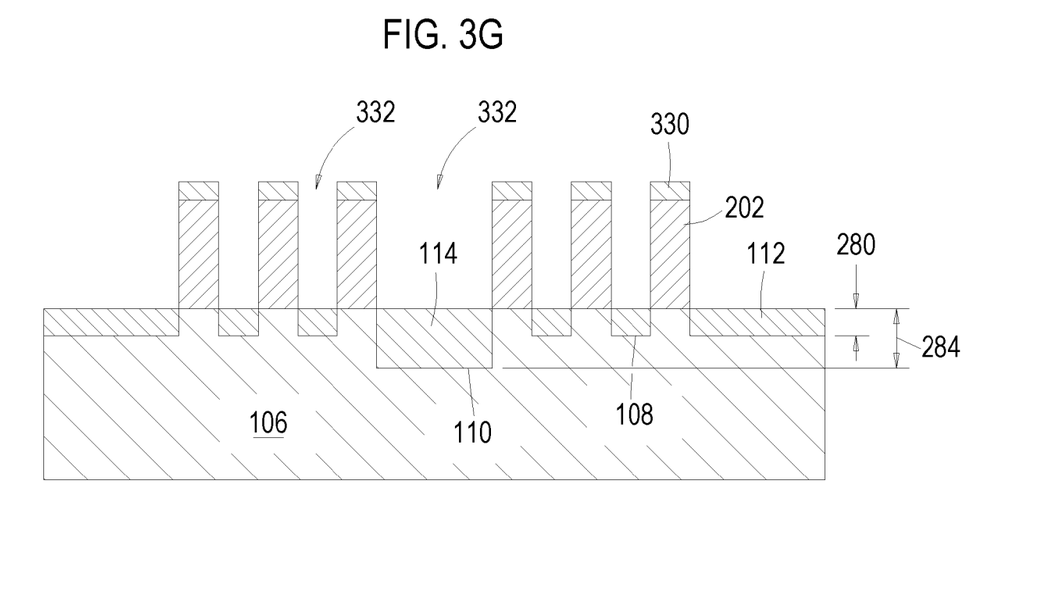
Figure 3H:
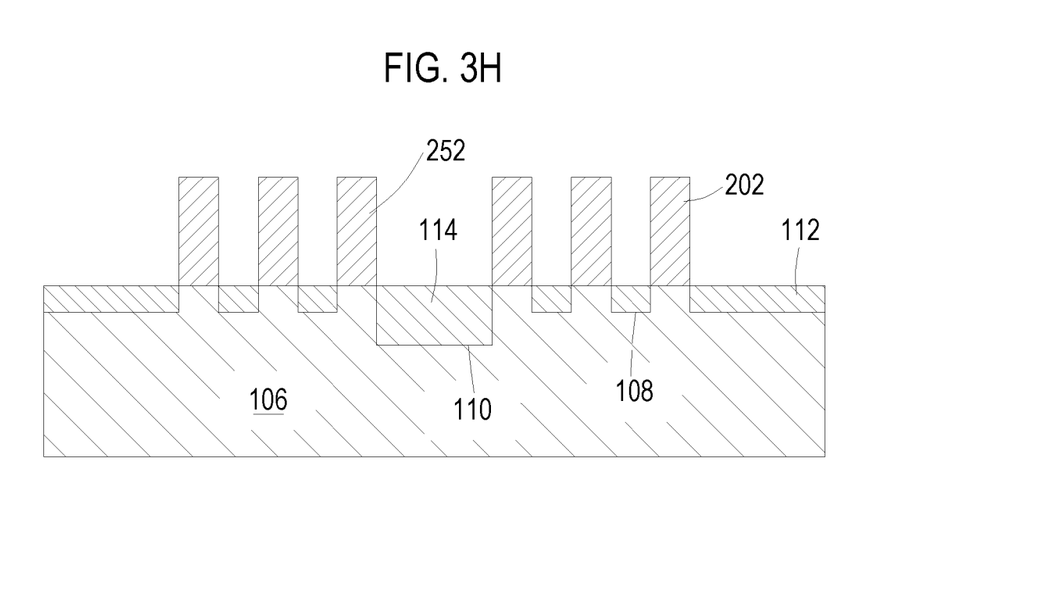

Once the trenches 108, 110 are filled with isolation material, a third mask layer 330 is deposited and patterned on the isolation material to form openings 332. The third mask layer 330 may be fabricated and patterned from materials and techniques such as described with reference to the first mask layer 300. At operation 414, a portion of the isolation material forming the isolation layers 112 and isolation layer 114 is etched through openings 332 in the third mask layer 330 to set the thickness 280 of the isolation material filling the trenches 108 and the thickness 284 of the isolation material filling the trench 110, as illustrated in FIG. 3G.

At operation 416, the third mask layer 330 is removed. The third mask layer 330 may be removed by ashing in the presence of an oxygen containing plasma, or other suitable method. After operation 416, the gates 208, 258 are formed over the fins 202, 252 to form the transistors 102, 104 as illustrated in FIGS. 1 and 2.

Thus, the FinFETs 102, 104 and particularly the P-N junction 150 described herein have greater SEL resistance as compared to conventional FinFETs and conventional P-N junctions. As the FinFETs 102, 104 comprising the P-N junction 150 have a reduced probability of SEL events due to high energy particle strikes as compared to conventional FinFETs, the electronic device 100, such as CMOS or other electronic devices, are more robust compared to conventional electronic devices. The increased thickness of the isolation layer 114 disposed between the N-type FinFET 102 and the P-type FinFET 104 allows most of the charge from impacting particles to be dissipated in the substrate before diffusing around the large area due to the relatively thicker material comprising of the isolation layer 114 disposed in the deeper trench 110 (as compared to trenches 108), thus adding an extra protection again multi-bit upsets and minimizing the occurrence of uncorrectable events in electronic devices 100 in which P-N junction 150 is utilized. Advantageously, the FinFETs 102, 104 comprising the P-N junction 150 are up to 10 times less susceptible to SEL events than traditional FinFETs, desirably approaching and even equaling that of planar transistors.

While the foregoing is directed to embodiments of the present invention, other and further embodiments of the invention may be devised without departing from the basic scope thereof, and the scope thereof is determined by the claims that follow.

What is claimed is:

1. A semiconductor device comprising:
   a P-N junction;
   a first P-type FinFET;
   a first N-type FinFET disposed adjacent the first P-type FinFET; and
   a first isolation layer disposed in a trench and laterally separating the first N-type FinFET from the adjacent first P-type FinFET, the first isolation layer in the trench having a first width extending from the first N-type FinFET to the adjacent first P-type FinFET, the first isolation layer disposed in the trench having a first thickness and a first width;
   a second isolation layer laterally disposed adjacent the first N-type FinFET, the second isolation layer separated from the first isolation layer by the first N-type FinFET, the second isolation layer having a second thickness and a second width, the first thickness is greater than 200 nm and the second thickness is less than 80 nm, and the first width greater than the second width;
   a second N-type FinFET disposed adjacent the first N-type FinFET; and
   the second isolation layer laterally separating the first N-type FinFET from the adjacent second N-type FinFET.

2. The semiconductor device of claim 1, wherein the first P-type FinFET comprises:
   a third isolation layer disposed on a side of the first P-type FinFET opposite the first isolation layer, the third isolation layer having a thickness of less than half of the first thickness of the first isolation layer.

3. The semiconductor device of claim 2, wherein the first thickness of the first isolation layer is at least three times the thickness of the third isolation layer.

4. The semiconductor device of claim 1 further comprising: a second P-type FinFET disposed adjacent the first P-type FinFET; and
a third isolation layer laterally separating the first P-type FinFET from the adjacent second P-type FinFET, the third isolation layer having a thickness of less than half the first thickness of the first isolation layer.

5. The semiconductor device of claim 4, wherein the thickness of the third isolation layer is less than 80 nm and the thickness of the first isolation layer is between 200 nm and 250 nm.

6. The semiconductor device of claim 4, wherein the first width of the first isolation layer defined between the first P-type FinFET and the adjacent first N-type FinFET is greater than a width of the third isolation layer defined between the first P-type FinFET and the adjacent second P-type FinFET.

7. A semiconductor device comprising:
a P-N junction;
a first P-type FinFET;
a first N-type FinFET disposed adjacent the first P-type FinFET;
a second FinFET disposed adjacent one of the first P-type FinFET and first N-type FinFET, the second FinFET being of the same type as a closer of the first P-type FinFET and first N-type FinFET;
a first isolation layer disposed in a trench and laterally separating the first N-type FinFET from the adjacent the first P-type FinFET, the first isolation layer having a first thickness and a first width, the first width extending from the first N-type FinFET to the adjacent first P-type FinFET;
a second isolation layer laterally disposed adjacent the first N-type FinFET, the second isolation layer having a second thickness and a second width; and
a third isolation layer disposed adjacent the first P-type FinFET, one of the second or third isolation layer laterally separating the second FinFET from the adjacent one of the first P-type FinFET and first N-type FinFET, the first thickness at least 200 nm and the second and third thicknesses less than 80 nm, the second isolation layer having a thickness thinner than the thickness of the first isolation layer, and the first width greater than each of the second and third widths.

8. A method for forming a semiconductor device having a P-N junction, the method comprising:
etching a semiconductor substrate to form a plurality of high aspect ratio fins,
the plurality of high aspect ratio fins including a first high aspect ratio fin and a second high aspect ratio fin separated by a first high aspect ratio trench that extends from the first high aspect ratio fin to the second high aspect ratio fin, and a third high aspect ratio fin separated by a second high aspect ratio trench from the second high aspect ratio fin;
filling the first high aspect ratio trench and the second high aspect ratio trench with an insulation material;
removing a portion of the insulation material filling the first high aspect ratio trench and the second high aspect ratio trench while stopping the removal of the insulation material filling the first high aspect ratio trench to form a first isolation layer having a first thickness and a first width and a second isolation layer having a second thickness and a second width, the first thickness greater than 200 nm and the second thickness less than 80 nm, and the first width greater than the second width, wherein etching the semiconductor substrate to form the plurality of high aspect ratio fins further comprises:
forming the first high aspect ratio fin in a p-doped region of the semiconductor substrate; and
forming the second and third high aspect ratio fins in an n-doped region of the semiconductor substrate, the first and second high aspect ratio fins separated by the first high aspect ratio trench.

9. The method of claim 8, wherein forming the first and second isolation layers further comprises:
forming the first thickness of the first isolation layer between 200 nm and 250 nm.

10. The method of claim 8, wherein filling the first high aspect ratio trench with the insulation material comprises:
filling the first high aspect ratio trench with at least one material selected from the group consisting of silicon oxide, silicon nitride, silicon oxynitride, fluoride-doped silicate glass (FSG), and a low-k dielectric.

11. The method of claim 8, wherein the first high aspect ratio fin is formed from silicon, silicon germanium, germanium or III-V material.

* * * * *